(12) United States Patent
Zhan et al.

(10) Patent No.: US 11,615,846 B2
(45) Date of Patent: Mar. 28, 2023

(54) ESTIMATING RESISTANCE-CAPACITANCE TIME CONSTANT OF ELECTRICAL CIRCUIT

(71) Applicant: Micron Technology, Inc., Boise, ID (US)

(72) Inventors: Huanyou Zhan, Milpitas, CA (US); Massimo Rossini, Rome (IT); Jun Xu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/832,117

(22) Filed: Jun. 3, 2022

(65) Prior Publication Data

US 2022/0293182 A1    Sep. 15, 2022

Related U.S. Application Data

(63) Continuation of application No. 17/175,301, filed on Feb. 12, 2021, now Pat. No. 11,393,533.

(51) Int. Cl.

| | |
|---|---|
| *G11C 16/10* | (2006.01) |
| *G11C 16/08* | (2006.01) |
| *G11C 16/04* | (2006.01) |
| *G01R 19/25* | (2006.01) |
| *G11C 16/26* | (2006.01) |

(52) U.S. Cl.
CPC .............. *G11C 16/08* (2013.01); *G01R 19/25* (2013.01); *G11C 16/0483* (2013.01); *G11C 16/10* (2013.01); *G11C 16/26* (2013.01)

(58) Field of Classification Search
CPC .................................................... G11C 16/10

USPC ..................................................... 365/185.25
See application file for complete search history.

(56) References Cited

U.S. PATENT DOCUMENTS

| | | | |
|---|---|---|---|
| 8,364,433 B1 | 1/2013 | Keramat | |
| 9,767,908 B2* | 9/2017 | Bushnaq | ................ G11C 16/10 |
| 2002/0131290 A1 | 9/2002 | Vo | |

(Continued)

FOREIGN PATENT DOCUMENTS

| | | |
|---|---|---|
| CN | 101124721 A | 2/2008 |
| CN | 105845181 A | 8/2016 |

OTHER PUBLICATIONS

USPTO, Notice of Allowance for U.S. Appl. No. 17/175,301, dated Mar. 7, 2022.

*Primary Examiner* — Jason Lappas
(74) *Attorney, Agent, or Firm* — Lowenstein Sandler LLP (57) ABSTRACT

Described are systems and methods for estimating the resistance-capacitance time constant of an electrical circuit (e.g., of a wordline of a memory device). An example system comprises: a memory device comprising a plurality of memory cells electrically coupled to a plurality of wordlines; a resistance-capacitance (RC) measurement circuit to measure a voltage at a specified wordline of the plurality of wordlines; and a processing device coupled to the memory device. The processing device is configured to: apply an initial voltage to a selected wordline of the plurality of wordlines; discharge the selected wordline for a discharge period of time; float the selected wordline until a voltage at the selected wordline is stabilized; determine, by the RC measurement circuit, a stabilized voltage at the selected wordline; and estimate, based on the stabilized voltage, an RC time constant of the wordline.

20 Claims, 8 Drawing Sheets

(56) References Cited

U.S. PATENT DOCUMENTS

| | | |
|---|---|---|
| 2016/0078958 A1 | 3/2016 | Wang |
| 2018/0261292 A1 | 9/2018 | Helm |
| 2019/0295669 A1 | 9/2019 | Yang |
| 2020/0321042 A1 | 10/2020 | Lee |

* cited by examiner

ESTIMATING RESISTANCE-CAPACITANCE TIME CONSTANT OF ELECTRICAL CIRCUIT

REFERENCE TO RELATED APPLICATIONS

This application is a continuation of U.S. patent application Ser. No. 17/175,301 filed on Feb. 12, 2021, which is incorporated by reference herein.

TECHNICAL FIELD

Embodiments of the disclosure relate generally to memory sub-systems, and more specifically, to estimating the resistance-capacitance time constant of an electrical circuit (e.g., of a wordline of a memory device).

BACKGROUND

Propagation of a signal across an electrical circuit can be dominated by resistive-capacitive effects. The resistive-capacitive delay can become a significant factor affecting the performance of an electrical circuit.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to estimating resistance-capacitance (RC) time constant of an electrical circuit (e.g., of a wordline of a memory device). A memory device can be a part of a memory sub-system, which can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can include two or more planes, such that each plane carries a matrix of memory cells etched onto a silicon wafer and joined by conductors referred to as wordlines and bitlines, such that a wordline joins multiple memory cells forming a row of the matric of memory cells, while a bitline joins multiple memory cells forming a column of the matric of memory cells. Depending on the cell type, each memory cell can store one or more bits of binary information, and has various logic states that correlate to the number of bits being stored. The logic states can be represented by binary values, such as "0" and "1", or combinations of such values. A set of memory cells referred to as a memory page can be programmed together in a single operation, e.g., by selecting consecutive bitlines.

An electrical circuit (or a part thereof) can be characterized by its resistance and capacitance, which can contribute to the resistance-capacitance (RC) delay of a signal being propagated over the electrical circuit. The RC delay can be characterized by an RC time constant (measured in seconds), which is equal to the product of resistance and capacitance. Thus, propagation of a signal from one end of an electrical line to another end of the electrical line is delayed by a value that is a function of the RC time constant of the electrical circuit.

The RC delay of an electrical circuit can inhibit the performance of many electronic devices. For example, in a memory device, a voltage signal can be applied to one or more bitlines and/or wordlines in order to perform one or more memory access operations, such as read operations and/or program operations. Various operational parameters, such as the wordline overdrive voltage, the bitline precharge time, and/or the program pulse width, can be adjusted based on the RC time constant of the wordline.

In some systems, the RC time constant of an electrical circuit can be obtained by direct measurements of the RC delay. However, direct measurements at an electrical circuit to determine the RC time constant may not always be feasible. Moreover, RC time constant values across electrical circuits of an electronic device can vary significantly, which renders determining the RC time constant values particularly challenging.

Aspects of the present disclosure address the above and other deficiencies by implementing a method that employs an RC measurement circuit for estimating the RC time constant of at least a part of an electrical circuit (e.g., of a wordline of a memory device). In an illustrative example, a wordline can be precharged to an initial voltage value, then discharged for a relatively short time period, and finally floated until the voltage value in the wordline stabilizes. The RC time constant of the wordline can then be determined as a function of the initial voltage value, the final stable voltage value, and the discharge time, as described in more detail herein below.

Advantages of this approach include, but are not limited to, improved performance in the memory sub-system by adjusting various operational parameters, such as the wordline overdrive voltage, the bitline precharge time, and/or the program pulse width, based on the estimated RC time constant of the wordline.

Figure 1:
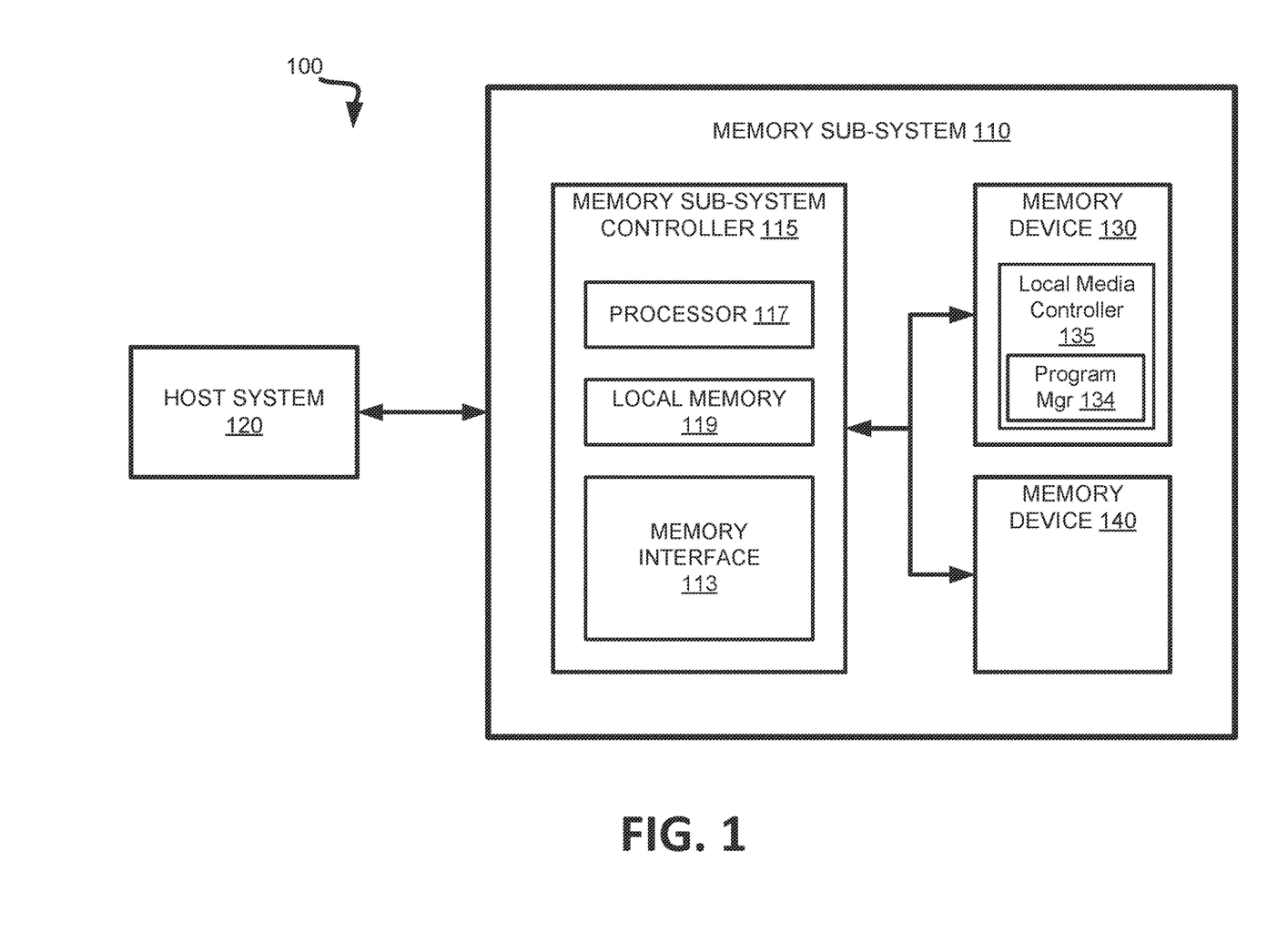
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. Memory interface components can determine and/or various parameters of the memory access commands based on the RC time constants that can be determined by implementing the methods described herein. In an illustrative example, the memory sub-system controller 115 can include a processor 117 (processing device) configured to execute instructions stored in local memory 119 for performing the operations described herein.

Figure 2:
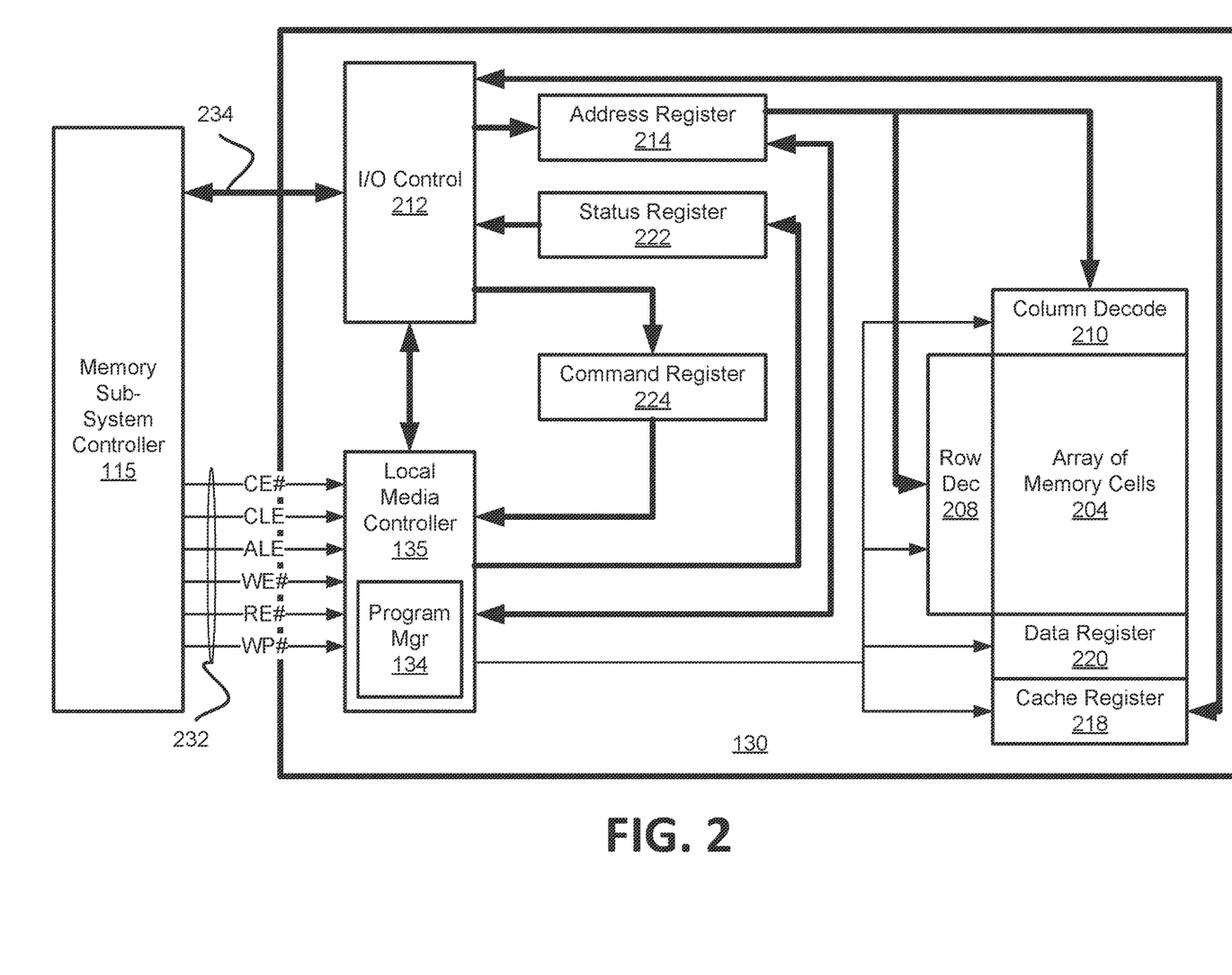
FIG. 2 is a block diagram of a memory device in communication with a memory sub-system controller of a memory sub-system, according to an embodiment.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. In one embodiment, local media controller 135 includes program manager 134, which can implement the programming of memory device 130, as described herein.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 220 for transfer to the array of memory cells 204; then new data may be latched in the cache register 218 from the I/O control circuitry 212. During a read operation, data may be passed from the cache register 218 to the I/O control circuitry 212 for output to the memory sub-system controller 115; then new data may be passed from the data register 220 to the cache register 218. The cache register 218 and/or the data register 220 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 222 may be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at I/O control circuitry 212 and then may be written into cache register 218. The data may be subsequently written into data register 220 for programming the array of memory cells 204.

In an embodiment, cache register 218 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

In some implementations, additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

Figure 3:
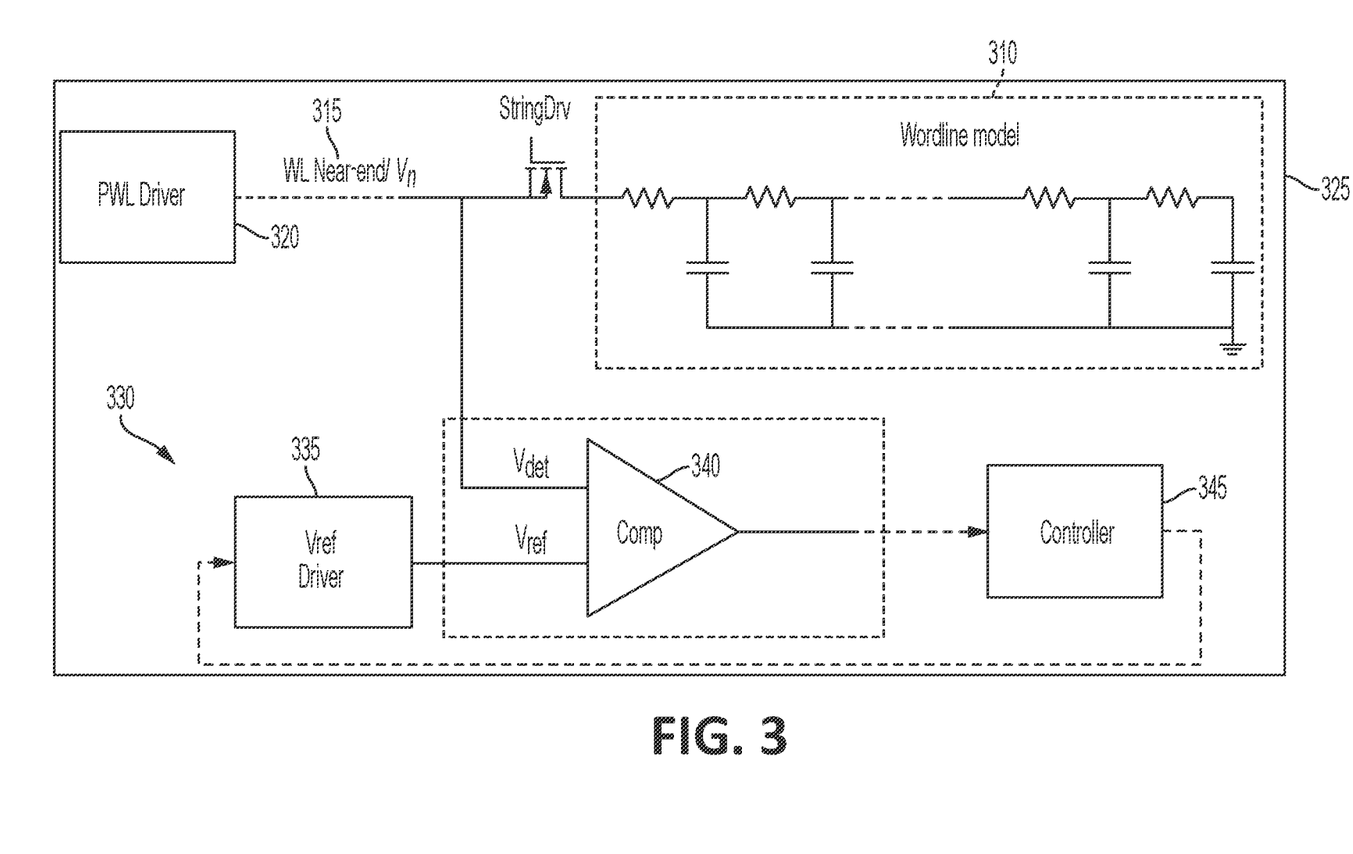
FIG. 3 is a diagram illustrating an example RC measurement circuit implemented in accordance with embodiments of the disclosure.

In some embodiments, a memory device can have a successive-approximation-register (SAR) analog-to-digital converter (ADC) installed, e.g., on every plane of the memory device for detecting the wordline leakage. The SAR ADC can include a reference voltage driver and a comparator, which can be utilized for measuring the stabilized voltage value at a given wordline, as schematically illustrated by FIG. 3. Utilizing the existing per-pane circuitry allows simultaneous measurements of the wordline RC time constant values for each plane of the memory device.

In various other embodiments, the example RC measurement circuit of FIG. 3 can be implemented by other components that are suitable for measuring the stabilized voltage value at a given wordline.

FIG. 3 is a diagram illustrating an example RC measurement circuit implemented in accordance with embodiments of the disclosure. The electrical circuit of interest (i.e., the electrical circuit whose RC time constant is being measured) is schematically represented by a resistor and capacitor network 310, which can emulate resistance and capacitance of the electrical circuit, including the resistance and capacitance of the components of the electric circuit and/or the parasitic resistance and capacitance of the electrical circuit of interest.

In some embodiments, the electrical circuit of interest can be represented by a wordline of a memory device 130. The wordline can include the near end 315 that is coupled to the programming voltage driver 320. The near end 315 can be electrically coupled to the first memory cell (not shown in FIG. 3) of the wordline. The far end 325 can be electrically coupled to the last memory cell (not shown in FIG. 3) of the wordline. The "near" and "far" end designations are only employed to specify the orientation of the wordline with respect to the voltage driver 320.

Figure 4:
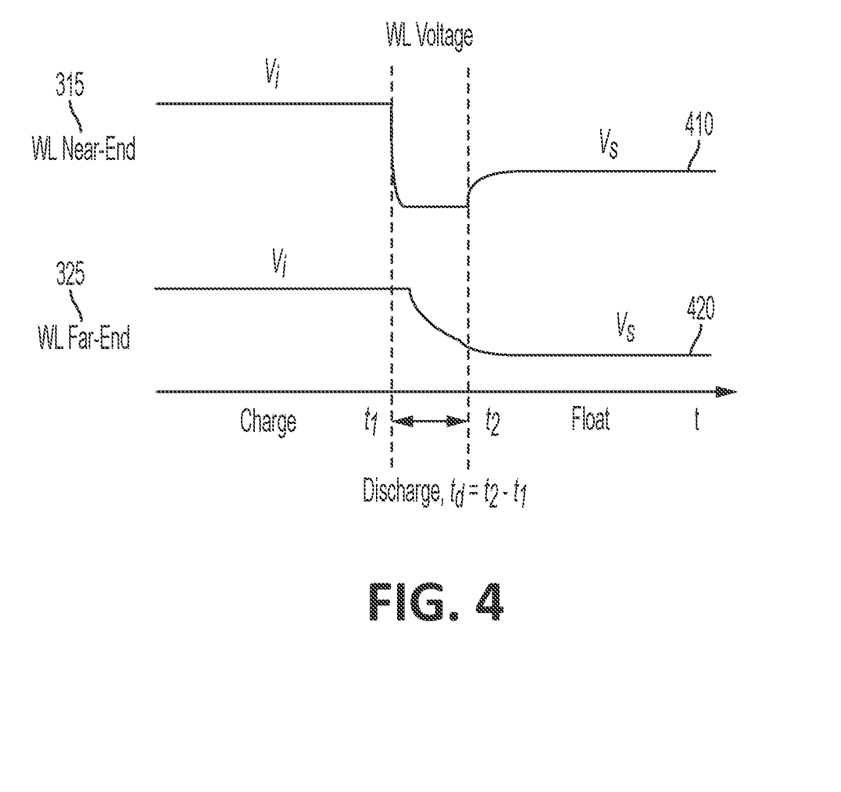
FIG. 4 schematically illustrates voltage levels measured at the near end and the far end of a wordline of a memory device, in accordance with embodiments of the disclosure.

As noted herein above, propagation of a signal over the electrical circuit 310 is delayed by a value that is a function of the RC time constant of the electrical circuit. The RC time constant of the electrical circuit 310 can be estimated by an RC measurement circuit 330 which includes a reference voltage driver 335 and a comparator 340. In operation, a wordline can be precharged, by the voltage provided by the voltage driver 320, to an initial voltage value, then discharged for a relatively short time period, and finally floated until the voltage value in the wordline stabilizes, as schematically illustrated by FIG. 4, which shows the voltage-time graphs 410, 420 of the voltage levels at the near end 315 and the far end 325 of the wordline. As schematically illustrated by FIG. 4, the initial voltage value $V_i$ is applied to the near end 315 of the wordline and is maintained till the time $t_1$, at which point the wordline is discharged (by electrically coupling the wordline to the ground) till the time $t_2$, at which point the wordline is floated (i.e., uncoupled from both the voltage supply and the ground) letting the voltage stabilize to the value of $V_s$. Thus, the discharge period of time td can be determined as the difference of the time $t_1$ when the wordline starts to be discharged and the time $t_2$ when the wordline starts to be floated.

Referring again to FIG. 3, the initial voltage and the stabilized voltage values can be measured by the comparator 340, which may determine the difference between the reference voltage $V_{ref}$ supplied by the reference voltage driver 335 and the detected voltage $V_{det}$ at the near end 315 of the wordline. The comparator 340 can output the comparison result to the controller 345, which can be represented by the memory sub-system controller 115 or the local media controller 135. The controller 345 can then adjust the reference voltage $V_{ref}$ to make it approach the detected voltage $V_{det}$ and thus determine the stabilized voltage value ($V_{det}$) based on $V_{ref}$. Then the controller can determine the RC time constant of the wordline as a function of the initial voltage value applied to the wordline, the stabilized voltage value measured at the wordline when the wordline is floated after discharging, and the discharge time.

In various embodiments, the RC measurement circuit 330 can, in addition to the components shown in FIG. 3, include various other components, such as amplifiers, integrating capacitors, etc.

Since the wordline voltage along the wordline length can be determined by performing the Laplacian transformation of the telegraph equation with known initial conditions and boundary conditions, the stabilized voltage can be found by integrating the wordline voltage along the wordline length:

$$V_s = \frac{1}{C}\int_{x=0}^{L} v(x, t_d)\frac{C}{L}dx = V_0 \sum_{k=1}^{\infty} \frac{2\left(1 - \cos\left(\left(k - \frac{1}{2}\right)\pi\right)\right)e^{\frac{-(2k-1)^2\pi^2 t_d}{4RC}}}{\left(k - \frac{1}{2}\right)^2 \pi^2} \quad (1)$$

where RC is the product of the resistance and capacitance of the electrical circuit of interest (e.g., a wordline of a memory device), $V_0$ is the initial voltage applied to the electrical circuit, $V_s$ is the stabilized voltage measured at the electrical circuit after the circuit has been discharged and floated, and $t_d$ is the discharge time.

Accordingly, using the equation (1), the controller (e.g., the memory sub-system controller 115 or the local media controller 135) can determine the RC value based on the known or measured values of the initial voltage, stabilized voltage, and the discharge time. In some implementations, the controller can numerically solve equation (1) to determine the RC value based on the known or measured values of the initial voltage, stabilized voltage, and the discharge time. Alternatively, the controller can determine the RC value by looking up the combination of the known or measured values of the initial voltage, stabilized voltage, and the discharge time in a pre-programmed look-up table mapping various combinations of values of the initial voltage, stabilized voltage, and the discharge time to corresponding RC values.

Figure 5:
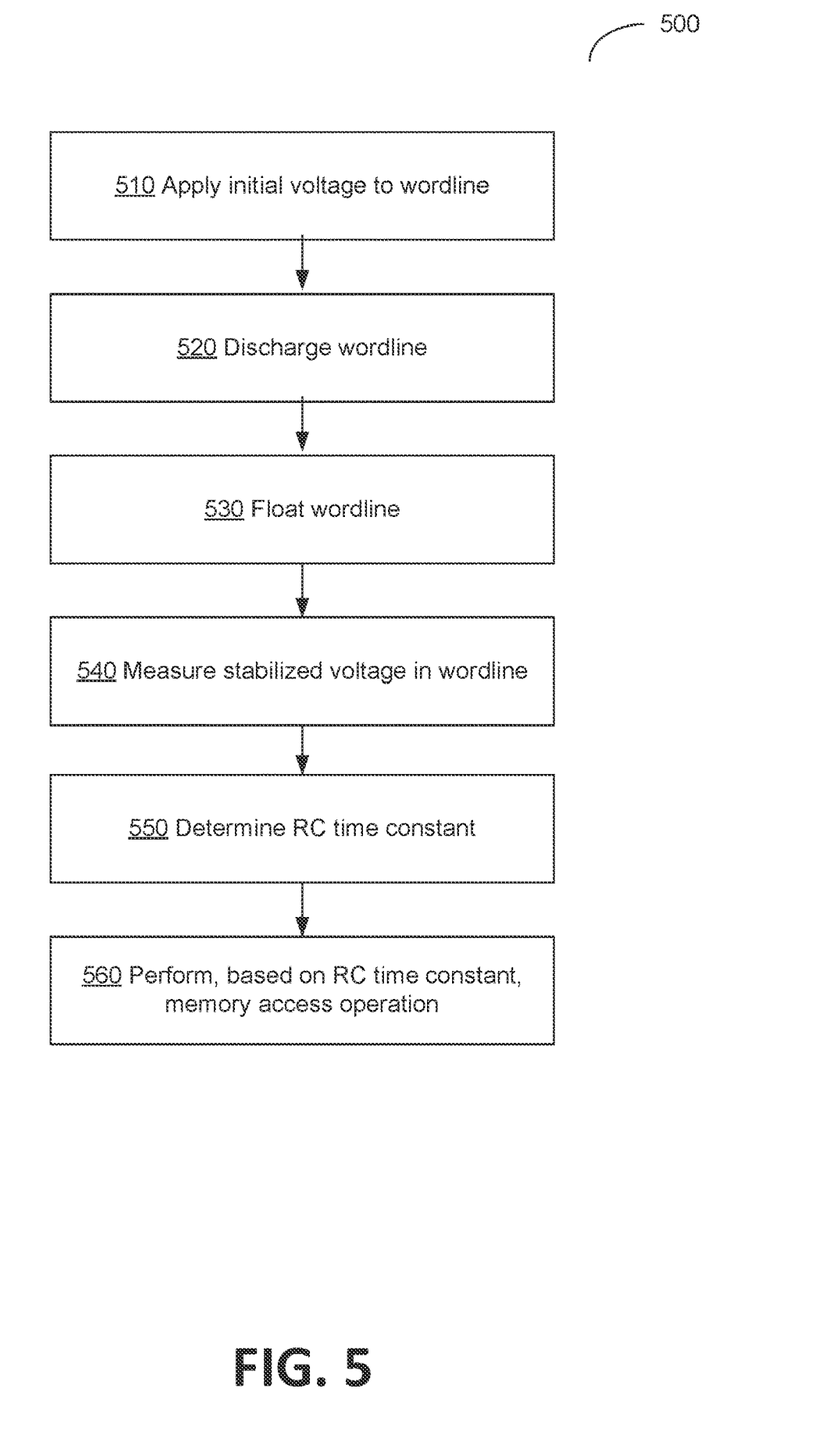
FIG. 5 is a flow diagram of an example method of estimating resistance-capacitance (RC) time constant of an electrical circuit in accordance with some embodiments of the present disclosure.

FIG. 5 is a flow diagram of an example method of estimating resistance-capacitance (RC) time constant of an electrical circuit in accordance with embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the memory sub-system controller 115 and/or the local media controller 135 using the RC measurement circuit 330 of FIG. 3. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 510, the controller may cause the voltage driver to apply the initial voltage to a specified wordline. The initial voltage value can be specified by the controller, e.g., to be equal to the precharge voltage that is normally utilized for precharging the wordlines of the memory device.

Upon precharging the wordline to the initial voltage, the controller can, at operation 520, discharge the wordline for a specified period of time, by causing the wordline to be electrically coupled to the ground. The discharge period of time can be specified by the controller, and can be estimated to allow the voltage in the wordline to fall below a certain voltage level with respect to the initial voltage.

Upon expiration of the discharge period of time, the controller can, at operation 530, float the wordline, e.g., by causing the wordline be uncoupled from both the voltage driver and the ground) for at least a specified period of time, during which the voltage in the wordline would stabilize.

At operation 540, the controller can measure the stabilized voltage in the wordline. In an illustrative example, the controller an employ an RC measurement circuit that includes a reference voltage driver and a comparator, as described in more detail herein above with references to FIG. 3.

At operation 550, the controller can determine the RC time constant corresponding to the stabilized voltage value. In an illustrative example, the controller can numerically solve equation (1) to determine the RC value based on the known or measured values of the initial voltage, stabilized voltage, and the discharge time. Alternatively, the controller can determine the RC value by looking up the combination of the known or measured values of the initial voltage, stabilized voltage, and the discharge time in a pre-programmed look-up table mapping various combinations of values of the initial voltage, stabilized voltage, and the discharge time to corresponding RC values.

At operation 560, the controller can utilize the estimated RC time constant for performing one or more memory access operations, such as read and/or programming operations.

In some implementations, the controller can perform wordline RC measurements to calibrate the trim values to be utilized in the user mode memory access operations. In an illustrative example, the controller can calibrate read operation parameters based on the estimated RC time constant, as schematically illustrated by FIG. 6.

Figure 6:
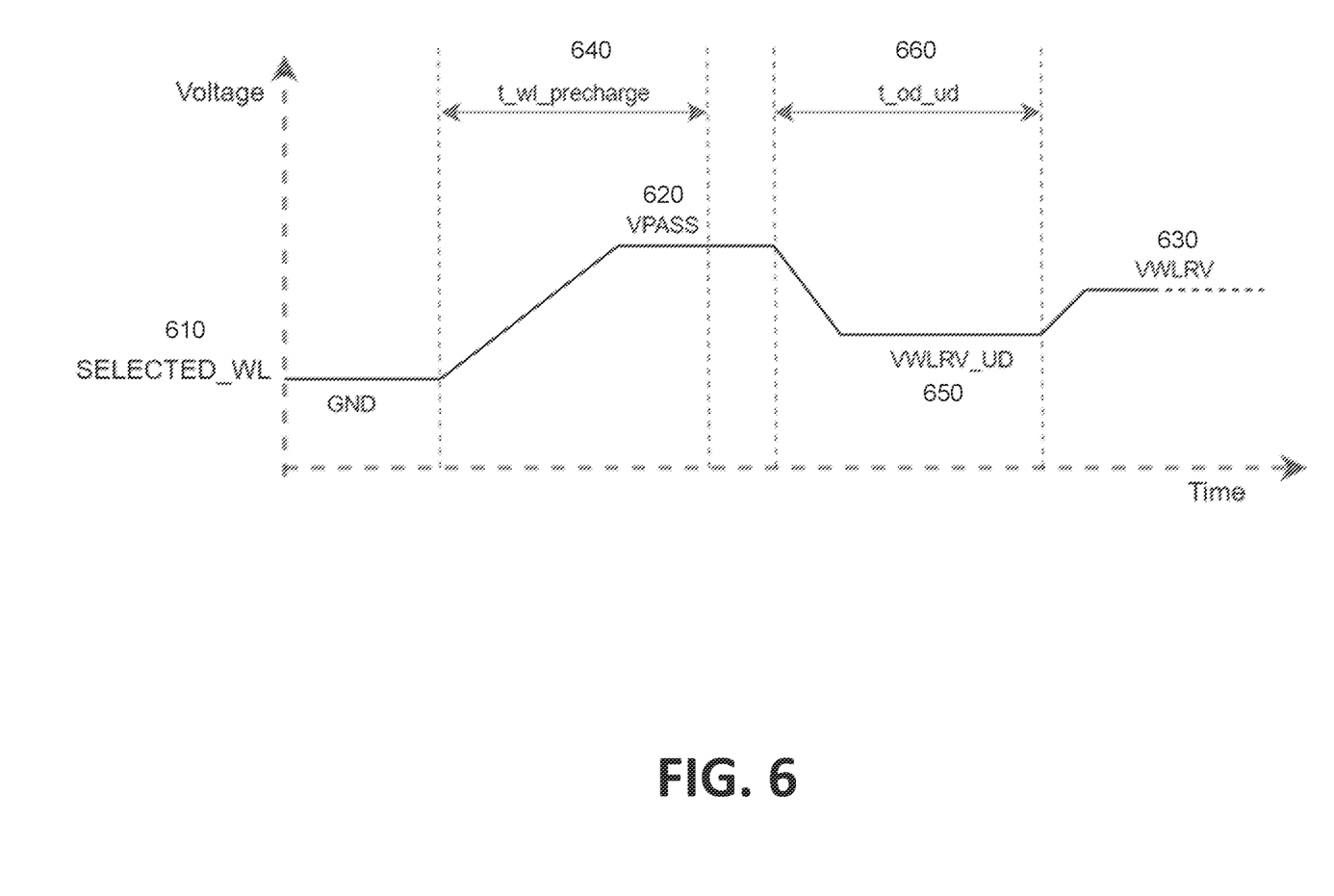
FIG. 6 schematically illustrates voltage levels and respective wordline charging times utilized for performing a read operation, in accordance with embodiments of the present disclosure.

FIG. 6 schematically illustrates voltage levels and respective wordline charging times utilized for performing a read operation, in accordance with embodiments of the present disclosure. In order to perform a read operation, the selected wordline 610 can initially be charged to the pass (VPASS) voltage level 610, and then to the wordline read-verify voltage (VWLRV) voltage level 630. Accordingly, if the RC time constant of the selected wordline is below a predetermine threshold level, the controller can reduce the precharge time 640, the wordline read-verify overdrive (VWLRV_UD) voltage level 650, and the overdrive time 660, thus reducing the read operation time. In some implementations, the controller may look up the estimated RC time constant of the wordline in a lookup table mapping RC time constant values to the corresponding precharge times, VWLRV_UD voltage levels, and overdrive times.

Figure 7:
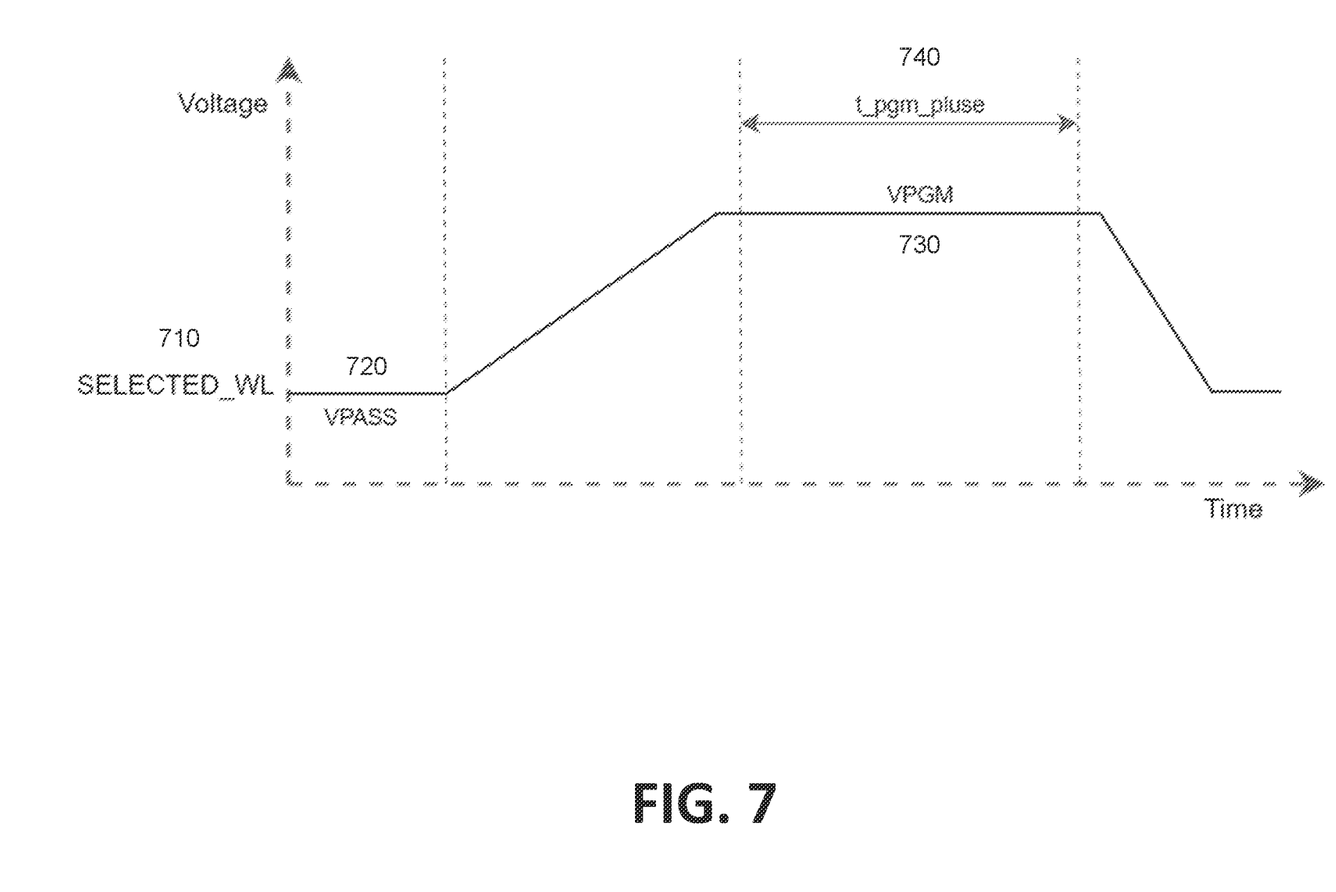
FIG. 7 schematically illustrates voltage levels and respective wordline charging times utilized for performing a program operation, in accordance with embodiments of the present disclosure.

In another illustrative example, the controller can calibrate program operation parameters based on the estimated RC time constant, as schematically illustrated by FIG. 7.

FIG. 7 schematically illustrates voltage levels and respective wordline charging times utilized for performing a program operation, in accordance with embodiments of the present disclosure. In order to perform a program operation, the selected wordline 710 can initially be charged to the pass (VPASS) voltage level 720, and then ramped up to the programming (VPGM) voltage level 730, which is applied for the program pulse time 740. Accordingly, if the RC time constant of the selected wordline is below a predetermine threshold level, the controller can reduce the program pulse time 740. In some implementations, the controller may look up the estimated RC time constant of the wordline in a lookup table mapping RC time constant values to the corresponding the program pulse times.

In some embodiments, RC time constant measurement can be implemented as a user mode command. Accordingly, the host can issue the RC time constant Measurement command before issuing memory access commands, thus reducing the time of performing read/program commands. Alternatively, the controller can perform RC time constant measurements in the background mode, while the memory device is idle, thus reducing the time of performing subsequent read/program commands.

Figure 8:
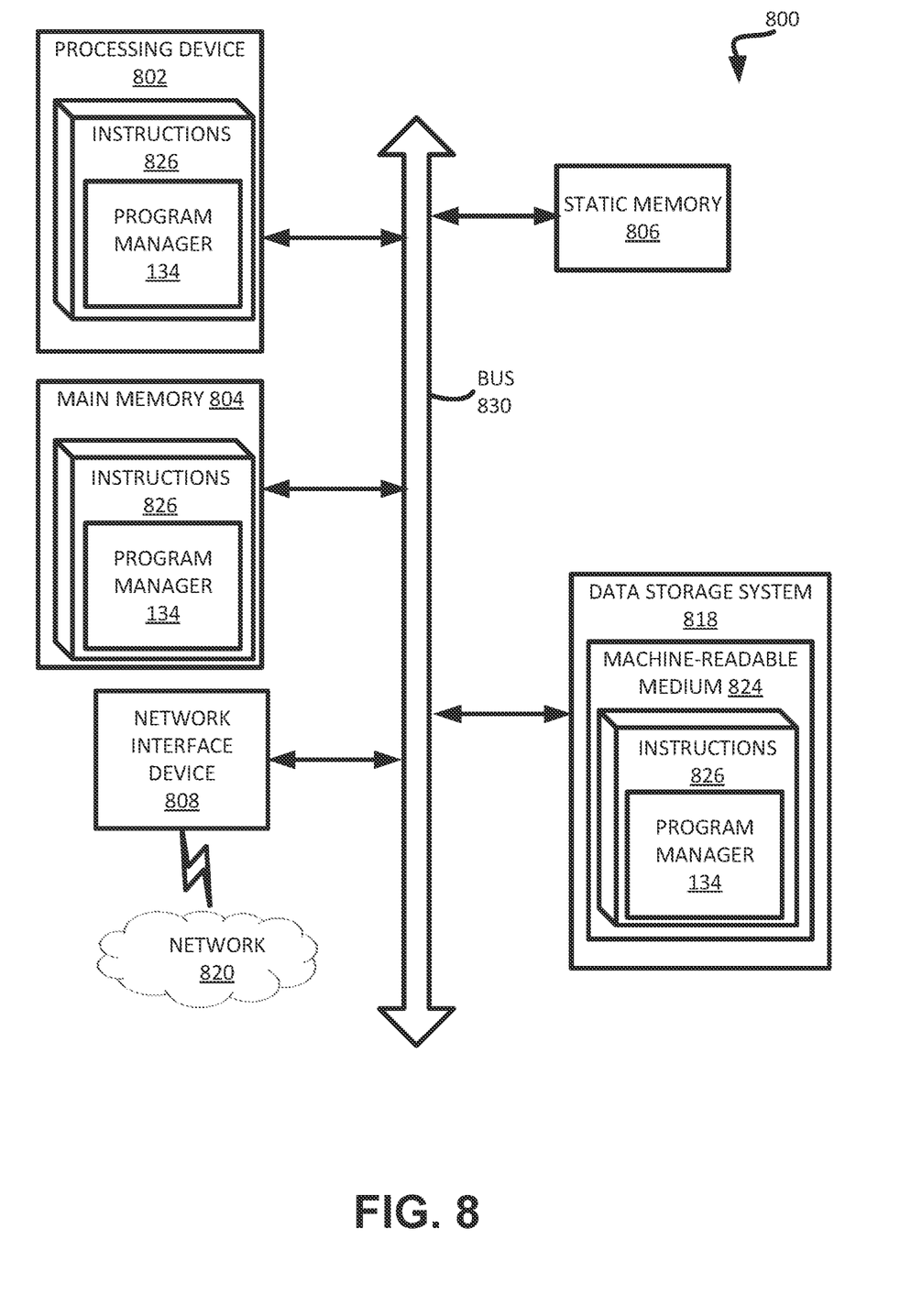
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to program manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium, such as a non-transitory computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to program manager 114 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
   a memory device comprising a plurality of memory cells electrically coupled to a plurality of wordlines;
   a resistance-capacitance (RC) measurement circuit to measure a voltage at a specified wordline of the plurality of wordlines; and
   a processing device coupled to the memory device, the processing device to:
   float a selected wordline of the plurality of wordlines until a voltage at the selected wordline is stabilized;
   determine, by the RC measurement circuit, a stabilized voltage at the selected wordline;
   estimate, based on the stabilized voltage, an RC time constant of the selected wordline; and
   perform a memory access operation with respect to the memory device, wherein a parameter of the memory access operation is determined based the RC time constant.

2. The system of claim 1, wherein the processing device is further to:
   determine, based on the RC time constant, a wordline read-verify overdrive voltage level; and
   utilize the wordline read-verify overdrive voltage level for performing the memory access operation.

3. The system of claim 1, wherein the processing device is further to:
   determine, based on the RC time constant, a program pulse time; and
   utilize the program pulse time for performing the memory access operation.

4. The system of claim 1, wherein the RC measurement circuit comprises a reference voltage driver coupled to a comparator, the comparator to produce a signal reflecting a difference between a reference voltage produced by the reference voltage driver and the voltage at the specified wordline.

5. The system of claim 1, wherein the memory device comprises a plurality of planes, each plane of the plurality of planes having a respective RC measurement circuit.

6. The system of claim 1, wherein floating the selected wordline further comprises:
   causing the selected wordline to be uncoupled from an electrical ground of the system and from a voltage driver.

7. The system of claim 1, wherein estimating the RC time constant further comprises:
   identifying, using a lookup table, the RC time constant corresponding the stabilized voltage.

8. A method, comprising:
   floating, by a processing device of a controller managing a memory device, a selected wordline of a plurality of wordlines until a voltage at the selected wordline is stabilized;
   determining, by an RC measurement circuit, a stabilized voltage at the selected wordline;
   estimating, based on the stabilized voltage, an RC time constant of the selected wordline; and
   performing a memory access operation with respect to the memory device, wherein a parameter of the memory access operation is determined based the RC time constant.

9. The method of claim 8, further comprising:
   determining, based on the RC time constant, a wordline read-verify overdrive voltage level; and
   utilizing the wordline read-verify overdrive voltage level for performing the memory access operation.

10. The method of claim 8, further comprising:
    determining, based on the RC time constant, a program pulse time; and
    utilizing the program pulse time for performing the memory access operation.

11. The method of claim 8, wherein a voltage at the selected wordline is determined by an RC measurement circuit comprising a reference voltage driver coupled to a comparator, the comparator to produce a signal reflecting a difference between a reference voltage produced by the reference voltage driver and the voltage at the selected wordline.

12. The method of claim 8, wherein the memory device comprises a plurality of planes, each plane of the plurality of planes having a respective RC measurement circuit.

13. The method of claim 8, wherein floating the selected wordline further comprises:
   causing the selected wordline to be uncoupled from an electrical ground and from a voltage driver.

14. The method of claim 8, wherein estimating the RC time constant further comprises:
   identifying, using a lookup table, the RC time constant corresponding the stabilized voltage.

15. A computer-readable non-transitory storage medium comprising executable instructions that, when executed by a processing device of a controller managing a memory device, cause the processing device to:
   float a selected wordline of a plurality of wordlines until a voltage at the selected wordline is stabilized;
   determine, by an RC measurement circuit, a stabilized voltage at the selected wordline;
   estimate, based on the stabilized voltage, an RC time constant of the wordline; and
   perform a memory access operation with respect to the memory device, wherein a parameter of the memory access operation is determined based the RC time constant.

16. The computer-readable non-transitory storage medium of claim 15, further comprising executable instructions that, when executed by the processing device, cause the processing device to:
   determine, based on the RC time constant, a wordline read-verify overdrive voltage level;
   and
   utilize the wordline read-verify overdrive voltage level for performing the memory access operation.

17. The computer-readable non-transitory storage medium of claim 15, further comprising executable instructions that, when executed by the processing device, cause the processing device to:
   determine, based on the RC time constant, a program pulse time; and
   utilize the program pulse time for performing the memory access operation.

18. The computer-readable non-transitory storage medium of claim 15, wherein the memory device comprises a plurality of planes, each plane of the plurality of planes having a respective RC measurement circuit.

19. The computer-readable non-transitory storage medium of claim 15, wherein floating the selected wordline further comprises:
   causing the selected wordline to be uncoupled from an electrical ground and from a voltage driver.

20. The computer-readable non-transitory storage medium of claim 15, wherein estimating the RC time constant further comprises:
   identifying, using a lookup table, the RC time constant corresponding the stabilized voltage.

* * * * *